(12) United States Patent
Kang et al.

(10) Patent No.: US 6,873,192 B2
(45) Date of Patent: Mar. 29, 2005

(54) POWER-UP DETECTION APPARATUS

(75) Inventors: Chang Seok Kang, Icheon-si (KR); Jae Jin Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,529

(22) Filed: Jun. 30, 2003

(65) Prior Publication Data

US 2004/0124894 A1 Jul. 1, 2004

(30) Foreign Application Priority Data

Dec. 31, 2002 (KR) ................................. 10-2002-0088153

(51) Int. Cl.[7] .............................................. H03K 17/22
(52) U.S. Cl. ...................................................... 327/143
(58) Field of Search ................................. 327/143, 198

(56) References Cited

U.S. PATENT DOCUMENTS

| | | | | |
|---|---|---|---|---|
| 4,902,910 A | * | 2/1990 | Hsieh .......................... | 327/143 |
| 5,027,006 A | * | 6/1991 | Queinnec et al. ............ | 327/143 |
| 5,343,082 A | * | 8/1994 | Han et al. ..................... | 327/34 |
| 5,440,178 A | * | 8/1995 | McClure ....................... | 327/34 |
| 5,748,034 A | * | 5/1998 | Ketineni et al. ............. | 327/551 |
| 5,760,612 A | * | 6/1998 | Ramirez ....................... | 327/34 |
| 5,936,443 A | * | 8/1999 | Yasuda et al. ............... | 327/143 |
| 6,078,201 A | * | 6/2000 | Crotty .......................... | 327/143 |
| 6,118,315 A | * | 9/2000 | Guedj .......................... | 327/143 |
| 6,204,701 B1 | * | 3/2001 | Tsay et al. .................... | 327/143 |
| 6,469,551 B2 | * | 10/2002 | Kobayashi et al. .......... | 327/143 |
| 6,476,651 B1 | * | 11/2002 | Watanabe .................... | 327/143 |
| 6,650,154 B2 | * | 11/2003 | Okuyama .................... | 327/143 |
| 2001/0054921 A1 | * | 12/2001 | Akiyoshi ..................... | 327/143 |
| 2004/0012419 A1 | * | 1/2004 | Kim et al. .................... | 327/143 |

* cited by examiner

*Primary Examiner*—Terry D. Cunningham
(74) *Attorney, Agent, or Firm*—Heller Ehrman White and McAuliffe LLP

(57) ABSTRACT

A power-up detection apparatus comprises a voltage divider, a potential detector and a buffer. The voltage divider divides an inputted power voltage in a predetermined ratio. The potential detector compares a predetermined potential with a potential outputted from said voltage divider, and outputs the comparison result. The buffer changes the level of said comparison result when said comparison result outputted from said potential detector is maintained at a predetermined potential for a predetermined period. As a result, a semiconductor device can be stably initialized because a power-up signal is generated only when an externally inputted power voltage is maintained at a current state over a predetermined period although the state of the external power voltage is toggled by noise.

10 Claims, 5 Drawing Sheets

POWER-UP DETECTION APPARATUS

BACKGROUND OF THE INVENTION

1. Field of the Invention

The present invention relates to a power-up detection apparatus for detecting a time when a power voltage is over a predetermined voltage level, and more specifically, to a power-up detection apparatus configured to perform a stable operation without being affected by power noise.

2. Description of the Related Art

Generally, a power-up detection apparatus initializes a semiconductor device when an externally applied power voltage reaches a predetermined potential. Thereafter, a semiconductor device performs a normal operation when the power voltage is over the predetermined potential.

FIG. 1 shows a circuit diagram of a conventional power-up detection apparatus.

The conventional power-up detection apparatus comprises a voltage divider 1, a potential detector 2, an inverter INV1, and a buffer 3. The voltage divider 1 divides a power voltage VCC in a predetermined ratio. The potential detector 2 compares a predetermined potential with a potential N0 outputted from the voltage divider 1, and then outputs a comparison result N1. The inverter INV1 inverts the potential N1 detected by the potential detector 2. The buffer 3 buffers an output signal N2 of the inverter INV1 to output a power-up signal PWR.

The voltage divider 1 includes resistors R1 and R2 connected in series between the power voltage VCC and a ground voltage. The divided potential N0 is outputted from a common node of the resistors R1 and R2.

The potential detector 2 includes a resistor R3 and a NMOS transistor NM1. The resistor R3 is connected in series between the power voltage VCC and the ground voltage. The NMOS transistor NM1 has a gate to receive the potential N0 divided by the voltage divider 1. The potential N1 is outputted from a node where the resistor R3 is connected in common to a drain of the NMOS transistor NM1.

The buffer 3 includes inverters INV2 and INV3 for sequentially inverting an output signal N2 from the inverter INV1.

The operation of the conventional power-up detection apparatus is described below.

The power-up detection apparatus detects a potential of an external power voltage VCC, and then generates a power-up signal PWR when the power voltage VCC reaches a predetermined potential.

Here, the power-up signal precharges a predetermined node or circuit to a high or low state for initialization of a chip, that is, for stabilization of an internal power source, until the internal power reaches a predetermined potential.

However, as shown in FIG. 2, if the external power voltage VCC accompanies ripple noise, the state of the power-up signal PWR toggles whenever the power voltage VCC reaches a predetermined potential. As a result, current consumption increases, and mis-operations may occur frequently.

Specifically, as an operation power voltage is lowered, the gap between the operation power potential level and the power potential level where the power-up signal is generated decreases. Accordingly, when noise is generated in the power potential, an undesired power-up signal can be generated, thereby initializing a semiconductor device.

SUMMARY OF THE INVENTION

Accordingly, it is an object of the present invention to provide a power-up detection apparatus where a power-up signal is generated only when a potential is maintained over a predetermined level over a predetermined time by using a time hysteresis device, thereby stably outputting a power-up signal even when a voltage level is unstable or noise is generated.

A power-up detection apparatus is provided comprising a voltage divider, a potential detector and a buffer. The voltage divider divides an inputted power voltage in a predetermined ratio. The potential detector compares a predetermined potential with a potential divided by said voltage divider, and outputs the comparison result. The buffer changes the level of said comparison result when said comparison result outputted from said potential detector is maintained at a predetermined potential for a predetermined period.

DETAILED DESCRIPTION OF THE PREFERRED EMBODIMENTS

The present invention will be described in detail with reference to the accompanying drawings.

Figure 1:
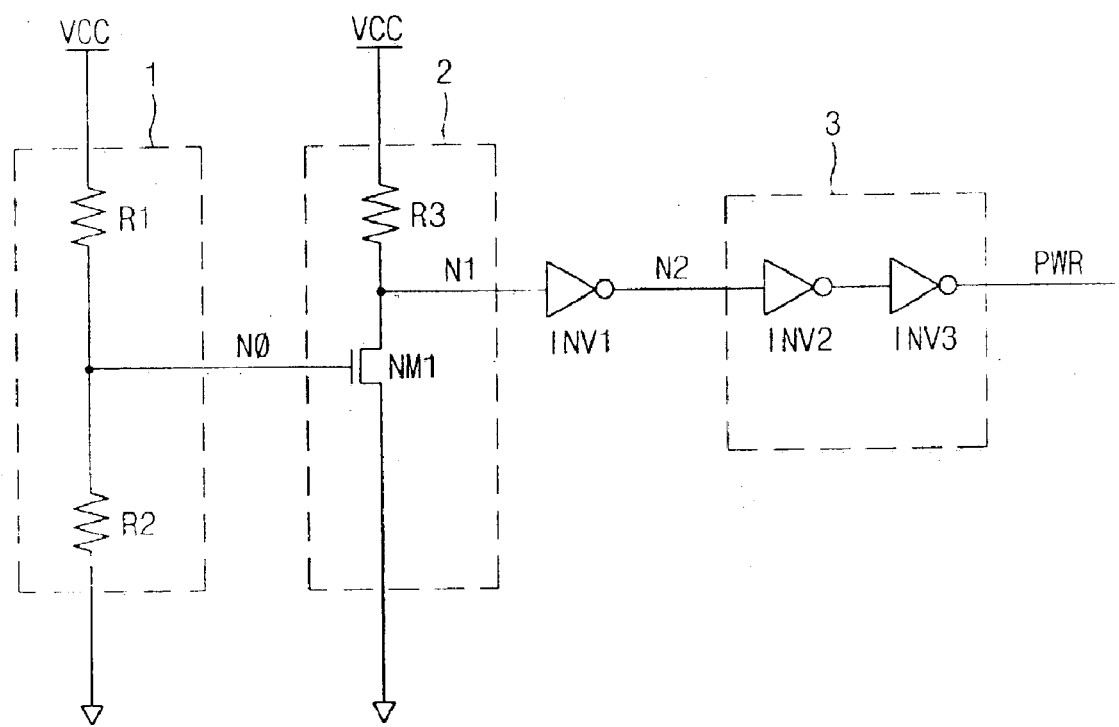
FIG. 1 shows a circuit diagram of a conventional power-up detection apparatus.
Figure 2A:
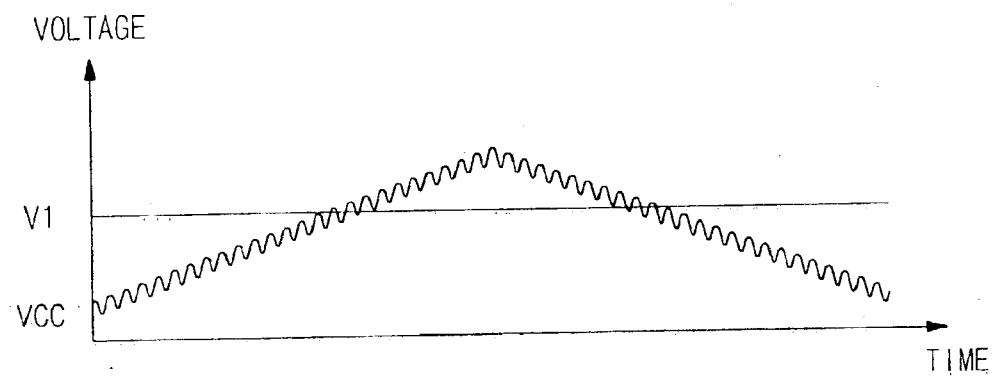
FIG. 2 is a timing diagram showing the operation of the power-up detection apparatus of FIG. 1.
Figure 2B:
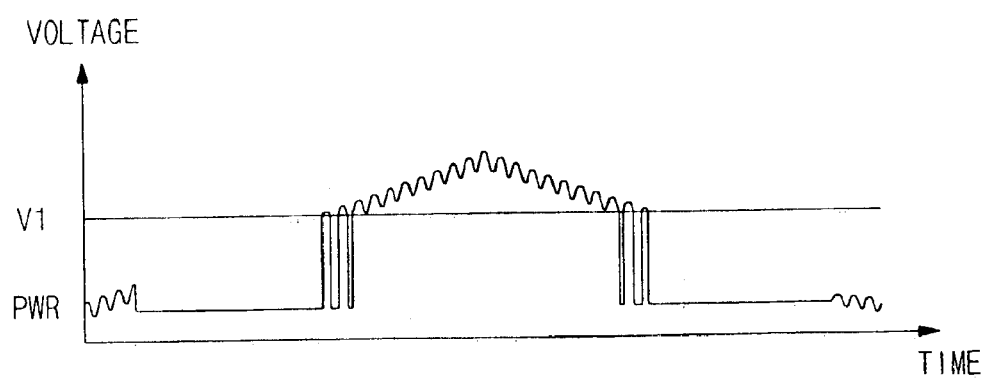
Figure 3:
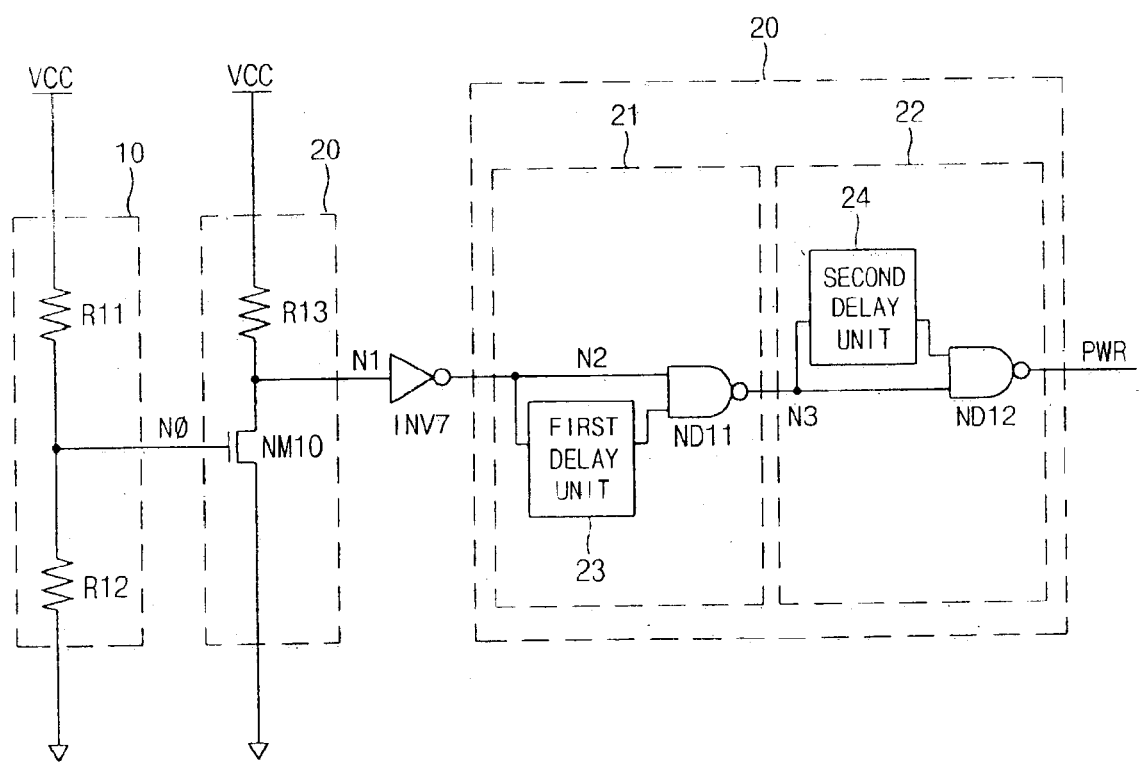
FIG. 3 shows a circuit diagram of a power-up detection apparatus according to the present invention.

FIG. 3 shows a circuit diagram of a power-up detection apparatus according to the present invention.

The power-up detection apparatus comprises a voltage divider 10, a potential detector 20, an inverter INV11 and a filter unit 30. The voltage divider 10 divides a power voltage VCC in a predetermined ratio. The potential detector 20 compares a predetermined potential with a potential N0 divided by the voltage divider 10, and outputs a comparison result N1. The inverter INV11 inverts a potential N1 detected by the potential detector 20. The filter unit 30 filters an output signal N2 from the inverter INV11, and outputs a power-up signal PWR.

Here, the voltage divider 10 includes resistor R11 and R12 connected in series between the power voltage VCC and a ground voltage. The divided potential N0 is outputted from a common node of the resistors R11 and R12.

The potential detector 20 includes a resistor R13 and a NMOS transistor NM11. The resistor R13 is connected in series between the power voltage VCC and the ground voltage VSS. The NMOS transistor N11 has a gate to receive the potential N0 outputted from the voltage divider 10. The potential N1 is outputted from a node where the resistor R13 is connected in common to a drain of the NMOS transistor NM11.

The filter unit 30 includes a high filter unit 21 and a low filter unit 22. The high filter unit 21 transits a potential of the power-up signal PWR to a high level only when the potential N2 outputted from the inverter INV11 is maintained at a high level for a predetermined time. The low filter unit 22 transits the potential of the power-up signal PWR to a low level only when the potential N2 outputted from the inverter INV11 is maintained at a low level for a predetermined time.

The high filter unit 21 includes a first delay unit 23 and a NAND gate ND11. The first delay unit 23 delays the output signal N2 of the inverter INV11 for a predetermined time. The NAND gate ND11 NANDs the output signal N2 from the inverter INV11 and an output signal from the first delay unit 23.

The low filter unit 22 includes a second delay unit 24 and a NAND gate ND12. The second delay unit 24 delays an output signal N3 from the high filter unit 21 for a predetermined time. The NAND gate ND12 NANDs the output signal N3 from the high filter unit 21 and an output signal from the second delay unit 24.

Figure 4:
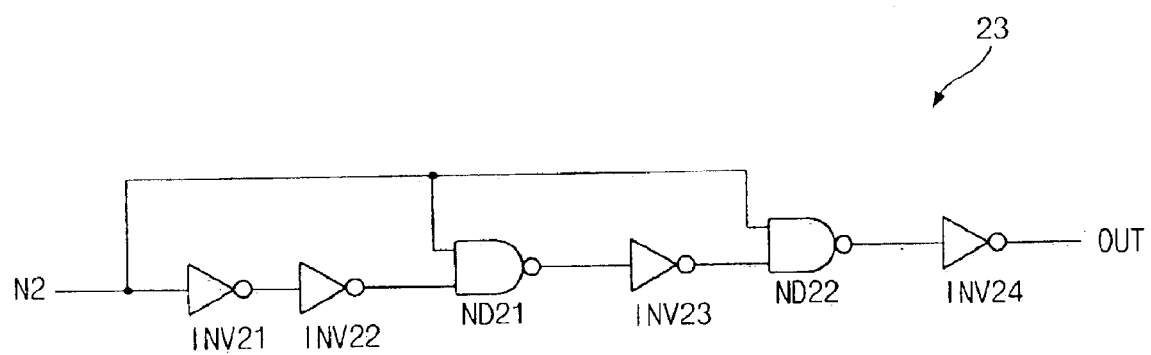
FIG. 4 shows a detailed circuit diagram of a delay unit of FIG. 3.

FIG. 4 shows a detailed circuit diagram of the first delay unit 23 of FIG. 3.

The first delay unit 23 includes inverters INV21, INV22, INV23 and INV24, and NAND gates ND21 and ND22. The inverters INV21 and INV22 sequentially invert the output signal from the inverter INV11. The NAND gate ND21 NANDs the output signal N2 from the inverter INV11 and an output signal from the inverter INV22. The inverter INV23 inverts an output signal from the NAND gate ND21. The NAND gate ND22 NANDs the output signal N2 from the inverter INV11 and an output signal from the inverter INV23. The inverter INV24 inverts an output signal from the NAND gate ND22, and outputs an output signal OUT.

Although the NAND gate structure is used herein, various types of delay circuits can be used according to a system or usage.

The second delay unit 24 may have the same structure as that of the first delay unit 23.

Figure 5A:
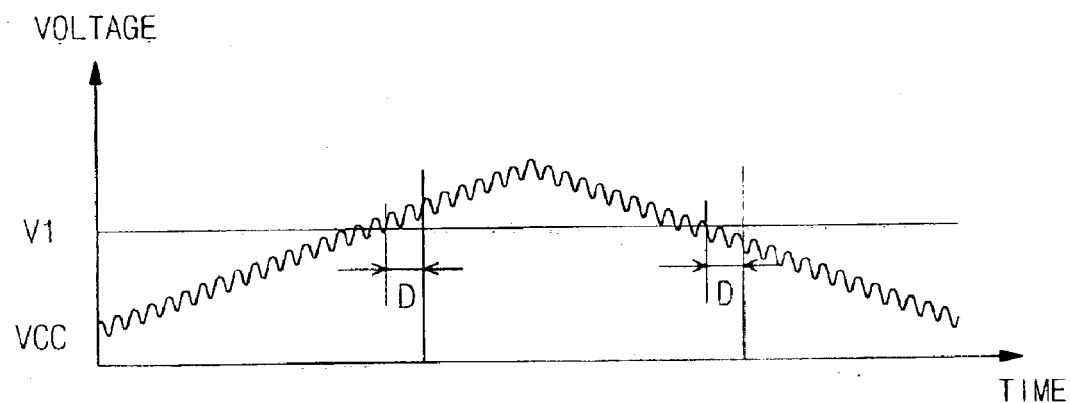
FIG. 5 is a timing diagram showing the operation of the power-up detection apparatus of FIGS. 3 and 4.
Figure 5B:
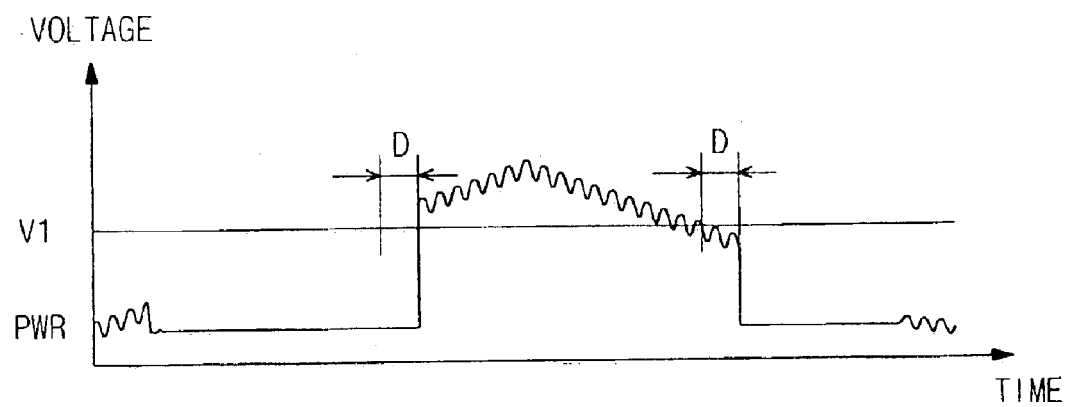

FIG. 5 is a timing diagram showing the operation of the power-up detection apparatus of FIG. 3.

When the external power voltage VCC with ripple noise reaches a predetermined potential V1, and it is maintained over a predetermined potential V1 for a predetermined time, a delay time D of the first delay unit 23, the power-up signal PWR transits to a high level. As a result, the power-up signal PWR does not transits to a high level because the power voltage VCC is not maintained at a high level for a predetermined time D although the power voltage VCC becomes higher than the predetermined voltage V1 for the noise having a short period of high level pulse.

Additionally, the power-up signal PWR does not transits to a low level because the power voltage VCC is not maintained below a predetermined potential V1 for a predetermined time D of the second delay unit 24 although the power voltage VCC becomes lower than the predetermined voltage V1 for the noise having a short period of low level pulse.

The delay time D of each delay unit 23 and 24 is adjustable according to the widths of high or low levels of the noise pulse at the design stage or adjustable by programming when an adjustable delay circuit is used.

As discussed earlier, a disclosed power-up detection apparatus can stably initialize a semiconductor device because a power-up signal is outputted only when an externally inputted power voltage is maintained over a predetermined level over a predetermined period although the power voltage is affected by noise.

What is claimed is:

1. A power-up detection apparatus, comprising:
  a voltage divider for dividing an inputted power voltage in a predetermined ratio;
  a potential detector for comparing a predetermined potential with a potential outputted from said voltage divider, and outputting a comparison result; and
  a buffer for changing the level of said comparison result when said comparison result outputted from said potential detector is maintained at a predetermined potential for a predetermined period,
  wherein said buffer includes:
    a first noise filter for changing the level of said comparison result when the comparison result outputted from said potential detector is maintained at a high level over a predetermined period; and
    a second noise filter for changing the level of said comparison result when an output signal from said first noise filter is maintained at a low level over a predetermined period.

2. The apparatus of claim 1, wherein said first noise filter includes:
  a delay means for delaying the comparison result outputted from said potential detector for a predetermined time; and
  an operating means for logically operating said comparison result and an output signal from said delay means.

3. The apparatus of claim 2, wherein a predetermined time of said delay means is set to be longer than an interval where a predetermined noise of said external power voltage is maintained at a high level.

4. The apparatus of claim 1, wherein said second noise filter includes:
  a delay means for delaying an output signal from said first noise filter for a predetermined time; and
  an operating means for logically operating said comparison result and an output signal from said delay means.

5. The apparatus of claim 4, wherein a predetermined delay time of said delay means is set to be longer than an interval where a predetermined noise of said external power voltage is maintained at a low level.

6. The apparatus of claim 2, wherein said delay means includes an adjustable delay line for regulating a delay time.

7. A power-up detection apparatus, comprising:
  a voltage divider for dividing an inputted power voltage in a predetermined ratio;
  a potential detector for comparing a predetermined potential with a potential outputted from said voltage divider, and outputting a comparison result; and
  a buffer for changing the level of said comparison result when said comparison result outputted from said potential detector is maintained at a predetermined potential for a predetermined period,
  wherein said buffer includes:
    a first delay means for delaying the comparison result outputted from said potential detector for a predetermined time;
    a first NAND gate for NANDing said comparison result and an output signal from said first delay means;
    a second delay means for delaying an output signal from said first NAND gate; and
    a second NAND gate for NANDing the output signal from said first NAND gate and an output signal from said second delay means.

8. The apparatus of claim 7, wherein a predetermined delay time of said first delay means is set to be longer than an interval where a predetermined noise of said external power voltage is maintained at a high level.

9. The apparatus of claim 7, wherein a predetermined delay time of said second delay means is set to be longer than an interval where a predetermined noise of said external power voltage is maintained at a low level.

10. The apparatus of claim 7, wherein said delay means includes an adjustable delay line for regulating a delay time.

* * * * *